(12) United States Patent
Linder et al.

(10) Patent No.: US 7,135,711 B2
(45) Date of Patent: Nov. 14, 2006

(54) ELECTROLUMINESCENT BODY

(75) Inventors: Norbert Linder, Grünthal (DE); Ernst Nirschl, Wenzenbach (DE); Werner Spath, Holzkirchen (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/488,487

(22) PCT Filed: Aug. 30, 2002

(86) PCT No.: PCT/DE02/03200

§ 371 (c)(1),
(2), (4) Date: Aug. 16, 2004

(87) PCT Pub. No.: WO03/026355

PCT Pub. Date: Mar. 27, 2003

(65) Prior Publication Data

US 2005/0001223 A1    Jan. 6, 2005

(30) Foreign Application Priority Data

Aug. 30, 2001 (DE) ................ 101 42 541
Nov. 27, 2001 (DE) ............. 201 19 230 U (51) Int. Cl.
*H01L 29/22* (2006.01)
*H01L 29/227* (2006.01)

(52) U.S. Cl. .......................... 257/98; 257/79; 257/82; 257/86; 257/88; 257/103

(58) Field of Classification Search ............... 257/79, 257/82, 86, 88, 103, 428, 431, 98; 438/22, 438/28, 69
See application file for complete search history.

(56) References Cited

U.S. PATENT DOCUMENTS

| 5,264,715 A | 11/1993 | Guenter et al. |
| 5,537,433 A * | 7/1996 | Watanabe ................ 372/45.01 |
| 5,813,752 A * | 9/1998 | Singer et al. ............... 362/293 |
| 6,117,529 A * | 9/2000 | Leising et al. .............. 428/209 |
| 6,563,142 B1 * | 5/2003 | Shen et al. ................... 257/98 |
| 2004/0084682 A1 * | 5/2004 | Illek et al. ..................... 257/80 |

FOREIGN PATENT DOCUMENTS

DE    199 11 717 A    9/2000

(Continued)

*Primary Examiner*—Zandra V. Smith
*Assistant Examiner*—Thanh Y. Tran
(74) *Attorney, Agent, or Firm*—Cohen, Pontani, Lieberman & Pavane (57) ABSTRACT

An electroluminescent component (1), in particular an LED chip, which has a high external efficiency in conjunction with a simple construction. The electroluminescent component (1) has a substrate (2); a plurality of radiation decoupling elements arranged at a distance next to one another on the substrate (2) and having an active layer stack (7) with an emission zone (8); and a contact element (9) on each radiation decoupling element (4). The contact elements (9), whose width (b') is dimensioned such that it is less than the width (b) of the radiation decoupling elements (4), are arranged centrally on the radiation decoupling elements (4), and the width (b) of the radiation decoupling elements (4), for a given height (h), is chosen to be so small that a substantial proportion of the light (11) radiated laterally from the emission zone (8) can be decoupled directly through the side areas (12) of the radiation decoupling elements (4).

15 Claims, 4 Drawing Sheets

FOREIGN PATENT DOCUMENTS

| | | |
|---|---|---|
| EP | 0 544 512 A1 | 11/1992 |
| EP | 0 977 280 A | 2/2000 |
| EP | 0 977 280 A2 | 2/2000 |
| JP | 04 223380 A | 12/1992 |
| WO | WO 96/37000 A1 | 11/1996 |
| WO | WO 99 31738 A | 6/1999 |
| WO | WO 00 45443 A | 8/2000 |
| WO | WO 01 41219 A | 6/2001 |

* cited by examiner

ELECTROLUMINESCENT BODY

RELATED APPLICATIONS

This is a U.S. national stage of application No. PCT/DE02/03200, filed on 03 Aug. 2002.

This patent application claims the priority of German patent applications 101 42 541.4 filed 30 Aug. 2001 and 201 19 230.6 filed 27 Nov. 2001, the disclosure content of which is hereby incorporated by reference.

FIELD OF THE INVENTION

The present invention relates to an electroluminescent body. It relates in particular to an LED chip in which an active layer stack has semiconductor material based on $Al_xGa_yIn_{1-x-y}N$ where $0 \leq x \leq 1$, $0 \leq y \leq 1$ and $x+y \leq 1$.

BACKGROUND OF THE INVENTION

Conventional LED chips usually have a single active layer stack extending over the entire growth area of a substrate. For the purpose of injecting current, such an LED chip has a so-called bonding pad at the front side of the LED chip and a whole-area contact metallization is applied at the rear side of the substrate, it being endeavored to expand the current flow through the LED chip as far as possible to the entire lateral extent of the active layer stack.

As an alternative to injecting current vertically, in the case of which the active layer stack is arranged in a sandwich-like manner between two contacts, there are also chip structures in which the contact connection both of the p-type side and of the n-type side is effected from the front side of the chip. This is usually the case when the substrate for the active layer stack is electrically insulated.

Despite a high efficiency of the light generating process in the active layer of up to almost 100%, such LED chips have relatively low external efficiencies. The term internal efficiency pertains to the number of generated photons divided by the number of injected electron-hole pairs. The term external efficiency pertains to the percentage of the generated photons that actually leave the semiconductor chip. The difficulty consists in decoupling the light which is generated in the areally grown active semiconductor layers having a high refractive index into the potting material having a significantly lower refractive index. In this case, it is usually only the primary light generated at a relatively small solid angle which passes toward the outside; the rest of the light is reflected back into the semiconductor by total reflection at the boundary between the semiconductor and a surrounding casting and a large part of said light is lost there through absorption in the active layer, in the substrate, at the substrate surface and at the electrical contact elements or the bonding pad.

An electroluminescent component with improved decoupling of light is known from DE 199 11 717 A1 for example. The monolithic electroluminescent component disclosed in this document has a substrate, on which are provided a multiplicity of radiation decoupling elements arranged next to one another with respect to the main radiating direction of the component. The radiation decoupling elements, which are preferably formed in cylindrical fashion, have an active layer sequence with an emission zone with at least one electroluminescent pn junction, downstream of which are arranged a so-called current aperture layer with a current passage opening for delimiting the emission zone and a contact layer. Annular contact elements are provided on the contact layers of the cylindrical radiation decoupling elements, said contact elements being interconnected by electrically conductive webs. These annular contacts cover only that region of the top side of the radiation decoupling elements through which only little radiation, or no radiation at all, would be decoupled anyway on account of total reflection at the interface between radiation decoupling element and the surrounding medium.

SUMMARY OF THE INVENTION

One object of the present invention is to provide an electroluminescent component which ensures a high efficiency of the decoupling of light in conjunction with a construction that is as simple as possible.

This object is achieved by means of an electroluminescent component having the features of claim 1. Subclaims 2 to 15 relate to advantageous refinements and developments of the invention.

This and other objects are attained in accordance with one aspect of the invention directed to an electroluminescent body, having a substrate. A plurality of radiation decoupling elements are arranged at a distance next to one another on the substrate and having a width and a height, which in each case have an active layer stack with an emission zone. A contact element is provided on each radiation decoupling element, wherein the contact elements have a width b', which is less than the respective width b of the assigned radiation decoupling element. The width b of the radiation decoupling elements, for a given height h, is chosen in such a way that substantially no light radiated laterally from the emission zone is subjected to total reflection at the side areas of the radiation decoupling elements, but rather is decoupled directly there.

The lateral extent of the emission zone essentially corresponds to the lateral extent of the contact element. This is achieved, for a low mobility of the charge carriers in the active layer between emission zone and contact element, as is the case for example for p-doped $Al_xGa_yIn_{1-x-y}N$ where $0 \leq x \leq 1$, $0 \leq y \leq 1$ and $x+y \leq 1$, preferably by virtue of the fact that the current spreading in this layer is so low that light is generated only in a narrow lateral region below the contact element. Reflection losses within the active layer stack are avoided to the greatest possible extent by virtue of the invention's dimensioning of the radiation decoupling elements, since a maximum proportion of the light radiated laterally can be decoupled directly through the side area of the radiation decoupling elements.

The radiation decoupling elements preferably have a strip-like structure having the above-mentioned width or a point-like structure having the above-mentioned diameter. Hereafter, for the sake of simplicity, mention is made exclusively of the width of the radiation decoupling element and of the width of the contact element, the diameter thereof being meant thereby in the case of a point-like structure of the radiation decoupling element and/or of the contact element.

Particularly if the emission zone of the active layer stack does not lie directly below the semiconductor surface, the radiation decoupling elements are preferably formed conically, their side facing the substrate having a larger cross-sectional area than their side facing the contact elements.

The dimensions of the radiation decoupling elements preferably satisfy the condition $$0 < (b+b')/h < 2\ \mathrm{ct}(\alpha_T)$$

where b is the width of the radiation decoupling elements, b' is the width of the contact elements, h is the height of the radiation decoupling elements and $\alpha_T$ is the critical angle of total reflection for the light emerging from the active layer stack into the surrounding medium.

For the case where the emission zone of the active layer stack in the radiation decoupling elements is positioned between the side facing the substrate and the side facing the contact elements, i.e. in particular not directly at the area facing the substrate or at the area facing the contact elements, the dimensions of the radiation decoupling elements advantageously satisfy the condition $$0 < (b+b')/h < \cot(\alpha)$$

where b is the width of the radiation decoupling elements, b' is the width of the contact elements, h is the height of the radiation decoupling elements and $\alpha_T$ is the critical angle of total reflection for the light emerging from the active layer stack into the surrounding medium.

BRIEF DESCRIPTION OF THE DRAWINGS

Further advantageous features, advantages and expediencies of the invention are explained in more detail below using various preferred exemplary embodiments with reference to the accompanying drawings, in which.

DETAILED DESCRIPTION OF THE DRAWINGS

Figure 1:
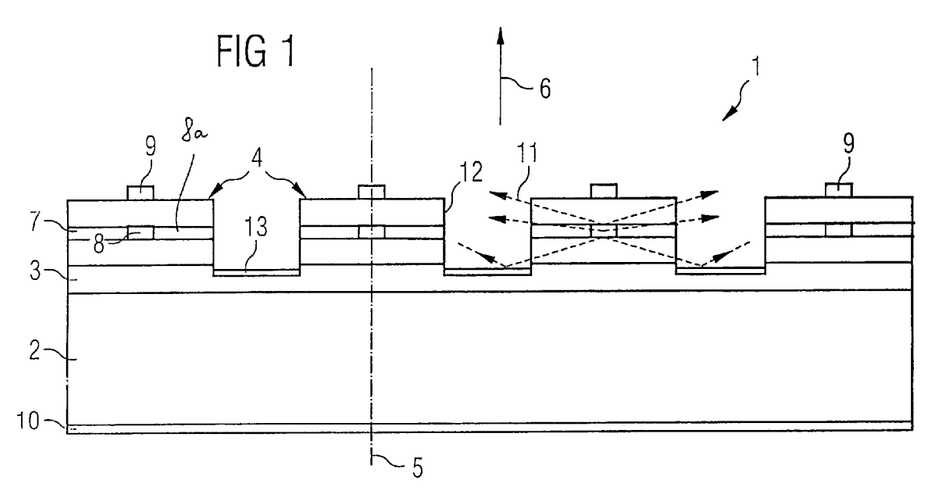
FIG. 1 shows a diagrammatic sectional illustration of a first exemplary embodiment of an electroluminescent component according to the present invention.

The exemplary embodiment of an electroluminescent component of FIG. 1 concerns an LED chip 1, from which a large part of the electromagnetic radiation 11 generated in the LED chip 1 is radiated in direction 6. The main radiating direction 6 is essentially oriented perpendicularly to the plane of main extent of the LED chip 1.

The LED chip 1 has a substrate 2, which has SiC or sapphire, for example, in the case of an LED chip 1 based on $Al_xGa_yIn_{1-x-y}N$ where $0 \leq x \leq 1$, $0 \leq y \leq 1$ and $x+y \leq 1$. A Bragg reflector layer 3 is optionally applied on the substrate 2, and reflects back the light radiated from the emission zone 8 (explained later) in the direction of the substrate 2. Such Bragg reflector layers 3 are known per se to the person skilled in the art and, therefore, are not explained in any further detail at this point.

A plurality of radiation decoupling elements 4 arranged at a distance next to one another are applied on said Bragg reflector layer 3. As explained in more detail further below with reference to FIGS. 4 and 5, said radiation decoupling elements may have, in plan view, a point-like structure (with for example a circular, oval or polygonal lateral cross-sectional area) or a strip-like structure (with for example a rectangular lateral cross-sectional area). The longitudinal central axes 5 of the radiation decoupling elements 4 are oriented parallel to the main radiating direction 6 of the LED chip 1.

The radiation decoupling elements 4 have, on the optionally provided Bragg reflector layer 3, an active layer stack 7 with an emission layer 8A and a laterally delimited emission zone 8, which has at least one electroluminescent pn junction.

In a particularly preferred embodied, the active layer stack 7 essentially comprises a plurality of doped and/or undoped $Al_xGa_yIn_{1-x-y}N$ layers where $0 \leq x \leq 1$, $0 \leq y \leq 1$ and $x+y \leq 1$. In principle, however, the structure according to the invention is also suitable for active layer stacks based on a plurality of $Al_xGa_yIn_{1-x-y}P$ or $Al_xGa_{1-x}As$ layers where $0 \leq x \leq 1$, $0 \leq y \leq 1$ and $x+y \leq 1$ or another suitable III–V or II–VI compound semiconductor.

The region between the contact element 9 and the emission zone 8 preferably completely comprises $Al_xGa_yIn_{1-x-y}N$ material, where $0 \leq x \leq 1$, $0 \leq y \leq 1$ and $x+y \leq 1$, which is p-doped with Mg and/or Zn, particularly preferably with Mg, and whose layer-parallel conductivity is so low that, in the event of current being injected into the chip, the current spreading in the region between contact element 9 and emission zone 8 is less than 20 μm, in particular between 0.1 μm and 10 μm, so that the lateral cross-sectional area of the emission zone 8 is to the greatest possible extent limited to the vertically projected area of the contact element 9.

The radiation 11 generated in the emission zone 8 of the active layer stack 7 essentially emerges in a lateral propagation direction through the side areas 12 of the radiation decoupling elements 4 from the active layer stacks 7 into the surrounding medium, such as, for example, a radiation-transmissive plastic capsulation (not illustrated) in which the LED chip is embedded and which comprises for example epoxy resin, silicone resin or another suitable reaction resin. Suitable electrically insulating and radiation-transmissive filling material may also be situated in the interspaces between the radiation decoupling elements 4.

Figure 4A:
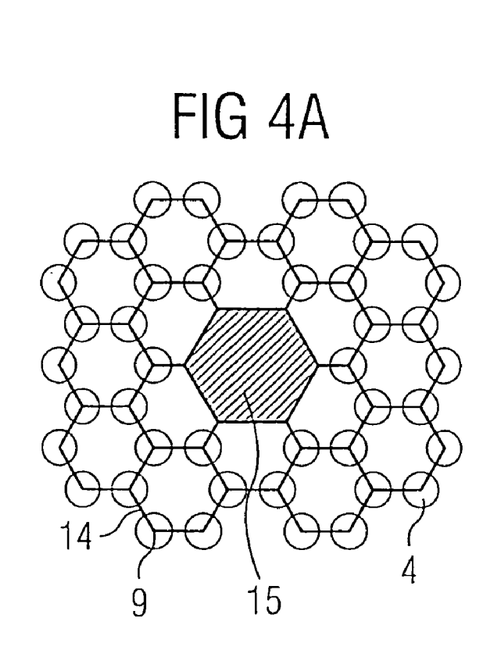
FIGS. 4A and B respectively show a diagrammatic illustration of a plan view of an electroluminescent component according to the present invention with radiation decoupling elements of point-like structure.
Figure 4B:
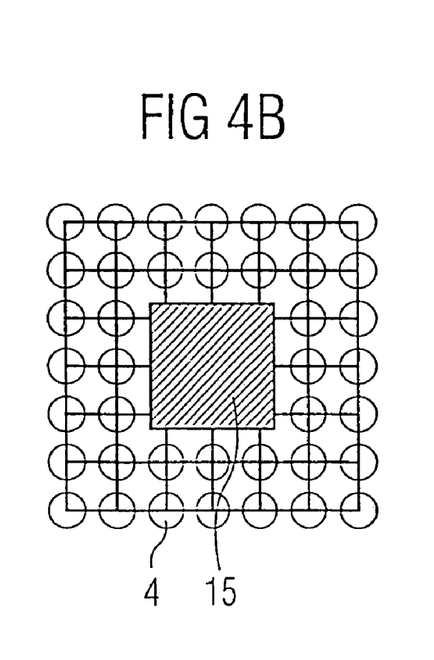
Figure 5A:
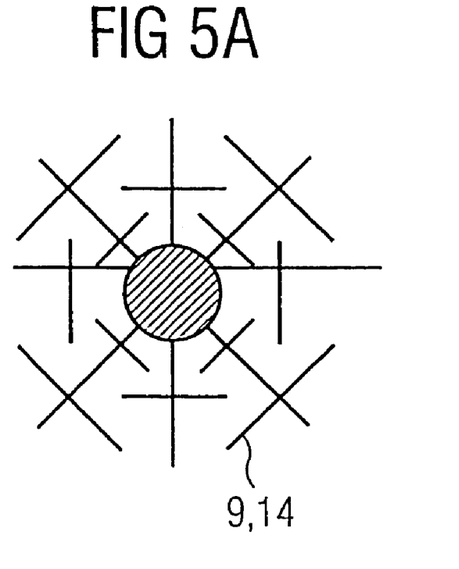
FIGS. 5A to C respectively show a diagrammatic illustration of a plan view of an electroluminescent component according to the present invention with radiation decoupling elements of strip-like structure.
Figure 5B:
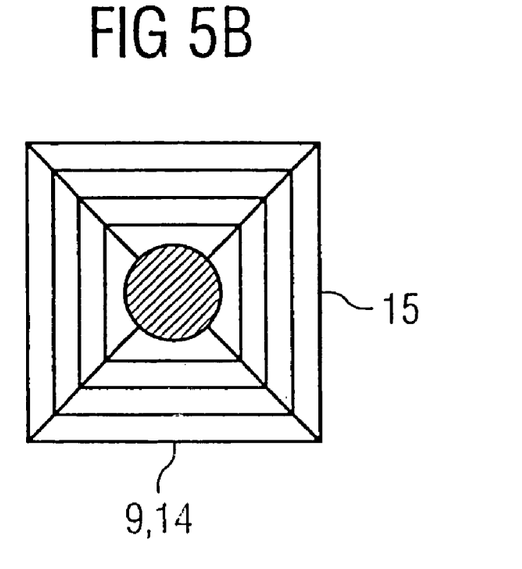
Figure 5C:
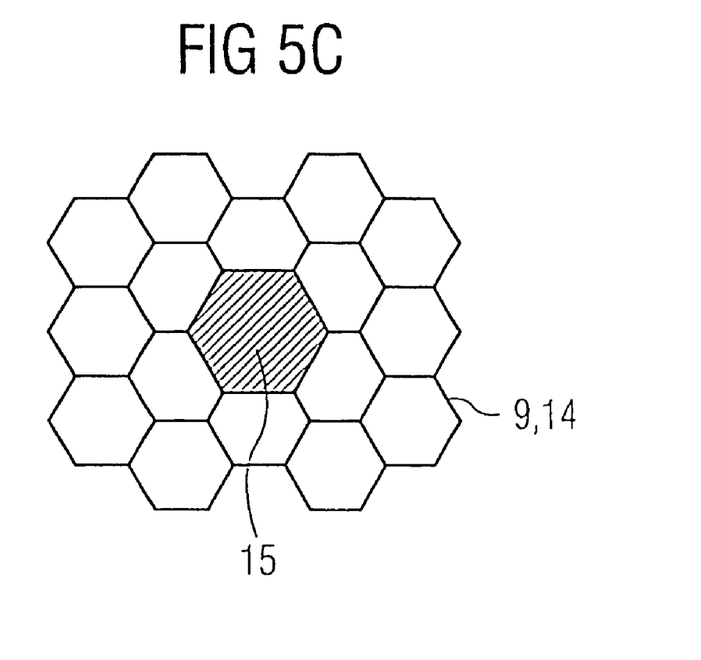

Centrally arranged contact elements 9 are provided on the top sides of the radiation decoupling elements 4. Between the contact elements 9 and the active layer stacks 7 of the radiation decoupling elements 4, a contact layer (not illustrated) may additionally also be applied at least below the contact elements 9. As illustrated in FIGS. 4 and 5, the individual contact elements 9 are connected to one another and to a bonding pad 15 on the front side of the LED chip 1 by means of electrically conductive webs 14. Depending on whether a point-like or a strip-like structure of the radiation decoupling elements 4 is present, the contact elements 4 are formed as contact points or as narrow contact strips.

A contact metallization 10 is applied over the whole area, by way of example, on that side of the substrate 2 which is remote from the radiation decoupling elements 4. However, a patterned contact metallization having, by way of example, mutually isolated contact areas assigned in each case to a radiation decoupling element 4 may also be applied here.

Between the radiation decoupling elements 4, a reflective layer 13 is preferably applied on the substrate 2 or the Bragg reflector layer 3 provided on the substrate 2, in order to reflect back the radiation 11 which is decoupled from the radiation decoupling elements 4 and passes downward to the substrate 2. This reflective layer 13 has advantages even in the case of non-absorbent substrates 2 since it is possible to reduce reflection and transmission losses which occur upon entry into and emergence from the substrate material.

The radiation decoupling elements 4 may be fabricated for example by means of whole-area epitaxial application of the Bragg reflector layer 3 and of the active layer stack 7 to the substrate 2 and a subsequent photolithography technique and etching. As an alternative, firstly a mask layer is applied to the Bragg reflector layer 3, openings corresponding to the structure of the radiation decoupling elements 4 being etched into said mask layer and the active layers 7 subsequently being deposited epitaxially into said openings. Finally, the mask layer is removed again by means of etching, for example.

The precise construction and the functioning of the radiation decoupling elements 4 of the electroluminescent component according to the invention will now be described using various embodiments with reference to FIGS. 2A to 2C.

In the exemplary embodiment illustrated in FIG. 2A, the emission zone 8 in the active layer stack 7 is provided directly below the contact element 9. While the height h of the active layer stack 7 is usually predetermined based on the intended function, the width b of the patterned radiation decoupling elements 4 is chosen, according to the invention, to be as small as possible. In the case of the exemplary embodiment of FIG. 2A, the width b of the active layer stack 7 preferably satisfies the condition $$0 < (b+b')/h < 2 \cot(\alpha_T)$$

where b' is the width of the contact element 9 which is dimensioned to be significantly less than the width b of the radiation decoupling element 4, and $\alpha_T$ is the critical angle of total reflection for the radiation 11 emerging from the active layer stack 7 into the surrounding medium. For GaN, $\alpha_T$ is 37°, by way of example, so that the ratio (b+b')/h should as far as possible be less than 2.65.

In some compound semiconductors, such as in p-doped $Al_xGa_yIn_{1-x-y}N$ for example, on account of a low mobility of the charge carriers, the current spreading is so low that the emission zone 8 essentially extends only to the vertically projected region of the emission layer 8a below the contact element 9, i.e. the lateral extent and thus also the width of the emission zone 8 is, if at all, only insignificantly greater than the lateral extent and thus the width b' of the contact element 9. By virtue of the above-described dimensioning of the active layer 7, a maximum proportion of the light 11 radiated laterally from the emission zone 8 can be decoupled directly through the side area 12. A total reflection essentially does not take place at the side area 12.

Moreover, a large part, i.e. approximately $\cos(\alpha_T)=60\%$, of the radiation primarily generated by the emission zone 8 is radiated into this angular range, so that this radiation can be decoupled into the surrounding medium to the side area 12 directly, i.e. without prior reflection processes at the upper and lower boundary layers of the active layer stack 7, which always also signify a reflection loss, and without further lossy passages through the emission layer 8a. In conventional systems, the radiation generated in the emission zones is usually reflected a number of times at the interfaces between active layer stack and substrate or top side of the active layer stack and surrounding medium before a decoupling is effected through the side areas. Moreover, non-radiative radiative losses as a result of surface recombinations can be avoided to the greatest possible extent according to the invention.

In contrast to the known components, such as, for example, the LED chip disclosed in DE 199 11 717 A1, the present invention provides an electroluminescent component which achieves a higher external efficiency of the decoupling of radiation without additional structuring measures such as the introduction of a current aperture layer or an oxide diaphragm.

Even if the dimensioning of the radiation decoupling elements 4 does not lie within the limits specified above for optimum decoupling of radiation, by virtue of the width b of the radiation decoupling elements 4 which is to be chosen to be as small as possible, advantages may be achieved in any event in comparison with the conventional systems since there is a reduction at least of the number of reflection and absorption processes connected with radiation losses before the decoupling from the radiation decoupling elements 4.

Figure 2A:
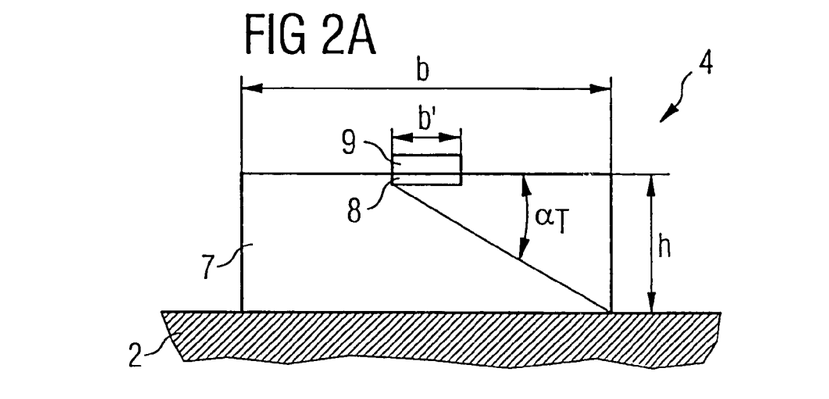
FIGS. 2A to 2C show diagrammatic sectional illustrations of different radiation decoupling elements such as can be used in the electroluminescent component of FIG. 1.
Figure 2B:
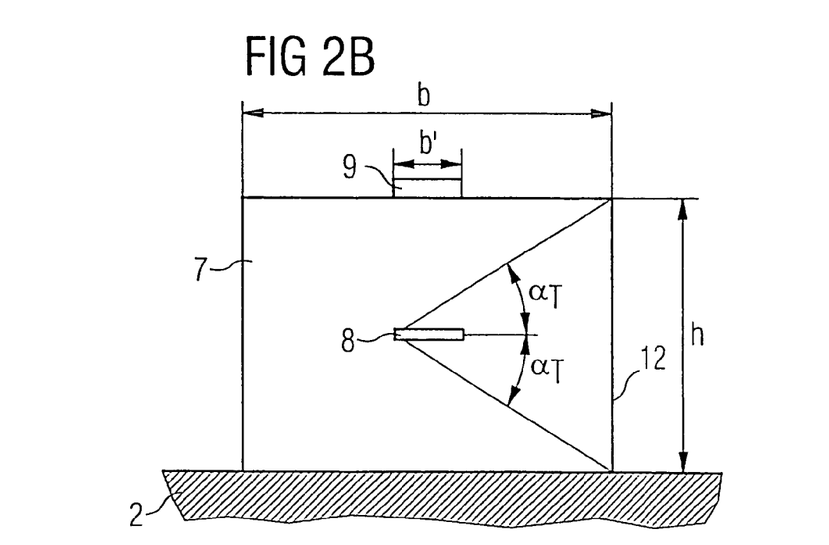
Figure 2C:
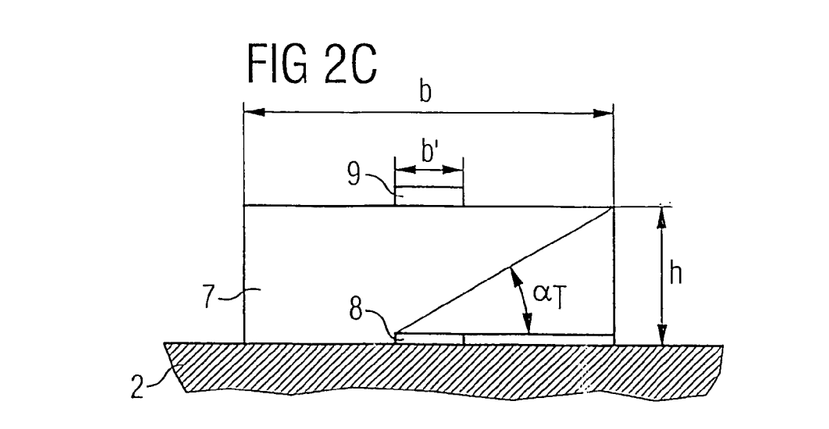

The same dimensioning of the radiation decoupling element 4 is chosen in the case of the exemplary embodiment of FIG. 2C, in which the emission zone 8 is provided directly above the substrate 2 or the Bragg reflector layer 3 possibly present.

In other words, in this case, too, the width b of the radiation decoupling elements should lie in the range $$0 < (b+b')/h < 2 \cot(\alpha_T)$$

in order that a large part of the radiation generated in the emission zone 8 is decoupled directly through the side areas 12 of the radiation decoupling elements 4.

FIG. 2B illustrates a radiation-decoupling element 4 in which the emission zone 8 is not provided directly at the upper or lower edge of the active layer stack 7, but rather is arranged approximately in the center of the active layer stack 7. Based on the same consideration as for the construction of the radiation decoupling element 4 as illustrated in FIG. 2A, the width b of the active layer stack 7 in this case should as far as possible satisfy the more stringent condition $$0 < (b+b')/h < \cot(\alpha_T)$$

in order to achieve the same effect.

The idea on which the present invention is based is, for a height h predetermined by the active layer stack 7, to restrict the width b of the active layer stack in such a way that a largest possible proportion of the light radiated laterally from the emission zone 8 can be decoupled directly through the side areas 12 since the angle at which the radiation impinges on the interface with the surrounding medium is less than the critical angle of total reflection. Therefore, the person skilled in the art will readily adapt the upper limit of the optimum dimensioning of the radiation decoupling element 4 between $\cot(\alpha_T)$ and $2\cot(\alpha_T)$ if the emission zone 8 is arranged at an arbitrary height position of the active layer stack 7 between the upper and the lower interface.

Figure 3:
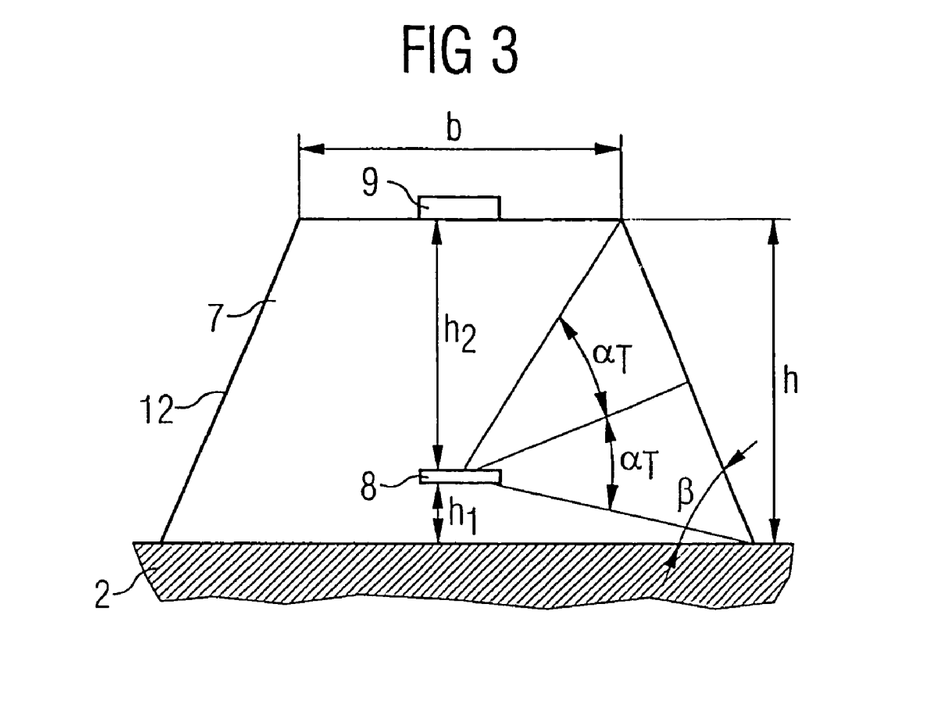
FIG. 3 shows a diagrammatic sectional illustration of a further variant of a radiation decoupling element such as can be used in the electroluminescent component of FIG. 1.

If the emission zone 8 in the active layer stack 7 does not lie directly below the contact element 9 as shown in FIG. 2A, a conical structuring of the radiation decoupling element 4 is advantageous, as is shown by way of example in FIG. 3.

In this exemplary embodiment, the side areas 12 of the radiation decoupling elements 4 are formed as oblique etching side walls, that side of the active layer stack 7 which faces the substrate 2 being larger than its side facing the contact elements 9. In the case of a point-like structure of the radiation decoupling elements 4, this leads for example to a structure in the form of a truncated cone.

The heights $h_1$ and $h_2$, specifying the position of the emission zone 8 within the active layer stack 7, are usually predetermined, based on the intended function, by the epitaxially applied layer 8 and, when added, produce the height of the radiation decoupling element 4 ($h_1+_2$=h). The structure width b and the base angle β of the oblique side areas 12 are then adapted in order to achieve an as far as possible optimum decoupling of light through the side areas 12 in such a way that the angular and side ratios preferably again satisfy the condition $$0<(b+b')/h<\cot(\alpha_T)$$

In this case, however, it must be taken into account that the critical angle $\alpha_T$ of total reflection is related to the perpendicular connection between the center point of the emission zone 8 and the side edge 12.

Various possibilities for the configuration of the LED chip 1 will now be described with reference to FIGS. 4 and 5. In this case, FIGS. 4A and 4B show, in plan view, exemplary embodiments with point-like structures of the radiation decoupling elements, while FIGS. 5A to 5C illustrate, in plan view, various exemplary embodiments with strip-like structures of the radiation decoupling elements.

The radiation decoupling elements 4 formed as cylinders or polyhedral have a contact point 9 centrally in each case at their top side. Said contact points 9 are connected via electrically conductive webs 14 both to one another and to a bonding pad 15 provided, by way of example, in the center of the LED chip 1. In this case, the radiation decoupling elements 4 are positioned for example on the corner points of an (imaginary) hexagonal structure (FIG. 4A) or rectangular structure (FIG. 4B). In FIGS. 4A and 4B, the light circles in each case indicate the top sides of the radiation decoupling elements with straight or conical side areas.

In the case of strip-like structures of the radiation decoupling elements 4 these emerge for example radially from a bonding pad 15 arranged in the center of the LED chip 1 and ramify further in regular geometrical forms (FIG. 5A). For the sake of better clarity, only the contact elements 9 and the corresponding connecting webs 14 are illustrated in FIG. 5A; the radiation decoupling elements 4 which run in a strip-like manner and in each case run below the electrical connecting elements 9, 14 have been omitted.

As an alternative, the radiation decoupling elements 4 structured in a strip-like manner may also be positioned in a rectangular arrangement (FIG. 5B) or a hexagonal arrangement (FIG. 5C). This arrangement of the radiation decoupling elements 4 exhibits advantages with regard to supplying all the radiation decoupling elements 4 with current.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. An electroluminescent body (1), having
    a substrate (2);
    a plurality of radiation decoupling elements (4) arranged at a distance next to one another on the substrate (2) and having a width (b) and a height (h), which in each case have an active layer stack (7) with an emission zone (8); and
    a contact element (9) on each radiation decoupling element (4),
    wherein
    the contact elements (9) have a width b', which is less than the respective width b of the assigned radiation decoupling element (4); and
    the width b of the radiation decoupling elements (4), for a given height h, is chosen in such a way that substantially no light radiated laterally from the emission zone (8) is subjected to total reflection at the side areas (12) of the radiation decoupling elements (4), but rather is decoupled directly at the side areas (12).

2. The electroluminescent body as claimed in claim 1, wherein
    the radiation decoupling elements (4) have a strip-like structure having the width (b).

3. The electroluminescent body as claimed in claim 1, wherein
    the radiation decoupling elements (4) have a point-like structure whose diameter corresponds to the width (b).

4. The electroluminescent body as claimed in claim 3, wherein
    the radiation decoupling elements (4) are formed in cylindrical or polyhedral fashion.

5. The electroluminescent body as claimed in claim 1, wherein
    the contact element (9) on the radiation decoupling elements (4) are electrically conductively connected to one another and to a bonding pad (15) on the front side of the component (1).

6. The electroluminescent body as claimed in claim 1, wherein
    the radiation decoupling elements (4) taper in the direction away from the substrate (2) at least over a part of their height h, in particular are formed conically, and in particular their side facing the substrate (2) is in each case larger than the side facing the contact elements (9).

7. The electroluminescent body as claimed in claim 1, wherein
    the dimensions of the radiation decoupling elements (4) satisfy the condition $$0<(b+b')/h<2\cot(\alpha_T)$$

where $\alpha_T$ is the critical angle of total reflection for the light emerging from the active layer stack (7) into the surrounding medium.

8. The electroluminescent body as claimed in claim 7, wherein
    for the case where the emission zone (8) of the active layer stack (7) in the radiation decoupling elements (4) is positioned between the side facing the substrate (2) and the side facing the contact elements (9), the dimensions of the radiation decoupling elements (4) satisfy the condition $$0<(b+b')/h<\cot(\alpha_T)$$

where $\alpha_T$ is the critical angle of total reflection for the light emerging from the active layer stack (7) into the surrounding medium.

9. The electroluminescent body as claimed in claim 1, wherein
    a reflective layer (13) is provided on the substrate (2) between the radiation decoupling elements (4).

10. The electroluminescent body as claimed in claim 1, wherein
    the region between contact element (9) and emission zone (8) at least partially comprises a material whose conductivity is so low that essentially no current spreading or a current spreading of at most 20 μm is effected in the event of the operating current being injected vertically in the region between the contact element (9) and the emission zone (8).

11. The electroluminescent body as claimed in claim 1, wherein
the active layer stack (7) has, at least between contact element (9) and emission zone (8), a semiconductor layer made of $Al_xGa_yIn_{1-x-y}N$, where $0 \leq x \leq 1$, $0 \leq y \leq 1$ and $x+y \leq 1$, the transverse conductivity of which is so low that essentially no current spreading or a current spreading of at most 20 μm is effected in the event of the operating current being injected vertically in the region between the contact element (9) and the emission zone (8).

12. The electroluminescent body as claimed in claim 11, wherein
at most a current spreading of between 0.1 μm and 10 μm is effected.

13. The electroluminescent body as claimed in claim 11, wherein
the semiconductor layer comprises $Al_xGa_yIn_{1-x-y}N$ which is p-doped in particular with Mg and/or Zn.

14. The electroluminescent body as claimed in claim 11, wherein
the active layer stack (7) is fabricated altogether from semiconductor layers made of $Al_xGa_yIn_{1-x-y}N$ where $0 \leq x \leq 1$, $0 \leq y \leq 1$.

15. The electroluminescent body as claimed in claim 11, wherein
the substrate (2) is a sapphire substrate.

* * * * *

UNITED STATES PATENT AND TRADEMARK OFFICE
CERTIFICATE OF CORRECTION

PATENT NO. : 7,135,711 B2
APPLICATION NO. : 10/488487
DATED : November 14, 2006
INVENTOR(S) : Norbert Linder et al.

It is certified that error appears in the above-identified patent and that said Letters Patent is hereby corrected as shown below:

Col. 7, line 57 - Col. 10, line 9, delete the following:

"1. An electroluminescent body "(1)", having a substrate "(2)";

a plurality of radiation decoupling elements "(4)" arranged at a distance next to one another on the substrate "(2)" and having a width b and a height h, which in each case have an active layer stack "(7)" with an emission zone "(8)";

and a contact element "(9)" on each radiation decoupling element "(4)", wherein the contact elements "(9)" have a width b', which is less than the respective width b of the assigned radiation decoupling element "(4)"; and the width b of the radiation decoupling elements "(4)", for a given height h, is chosen in such a way that substantially no light radiated laterally from the emission zone "(8)" is subjected to total reflection at the side areas "(12)" of the radiation decoupling elements "(4)", but rather is decoupled directly there.

2. The electroluminescent body as claimed in claim 1, wherein the radiation decoupling elements "(4)" have a strip-like structure having the width b.

UNITED STATES PATENT AND TRADEMARK OFFICE
CERTIFICATE OF CORRECTION

PATENT NO. : 7,135,711 B2
APPLICATION NO. : 10/488487
DATED : November 14, 2006
INVENTOR(S) : Norbert Linder et al.

It is certified that error appears in the above-identified patent and that said Letters Patent is hereby corrected as shown below:

3. The electroluminescent body as claimed in claim 1, wherein the radiation decoupling elements "(4)" have a point-like structure whose diameter corresponds to the width b.

4. The electroluminescent body as claimed in claim 3, wherein the radiation decoupling elements "(4)" are formed in cylindrical or polyhedral fashion.

5. The electroluminescent body as claimed in claim 1, wherein the contact element "(9)" on the radiation decoupling elements "(4)" are electrically conductively connected to one another and to a bonding pad "(15)" on the front side of the component "(1)".

6. The electroluminescent body as claimed in claim 1, wherein the radiation decoupling elements "(4)" taper in the direction away from the substrate "(2)" at least over a part of their height h, in particular are formed conically, and in particular their side facing the substrate "(2)" is in each case larger than the side facing the contact elements "(9)".

UNITED STATES PATENT AND TRADEMARK OFFICE
CERTIFICATE OF CORRECTION

| | |
|---|---|
| PATENT NO. | : 7,135,711 B2 |
| APPLICATION NO. | : 10/488487 |
| DATED | : November 14, 2006 |
| INVENTOR(S) | : Norbert Linder et al. |

It is certified that error appears in the above-identified patent and that said Letters Patent is hereby corrected as shown below:

7. The electroluminescent body as claimed in claim 1, wherein the dimensions of the radiation decoupling elements "(4)" satisfy the condition $0 < (b+b')/h < 2 \cot(\alpha_T)$ where $\alpha_T$ is the critical angle of total reflection for the light emerging from the active layer stack "(7)" into the surrounding medium.

8. The electroluminescent body as claimed in claim 7, wherein for the case where the emission zone "(8)" of the active layer stack "(7)" in the radiation decoupling elements "(4)" is positioned between the side facing the substrate "(2)" and the side facing the contact elements "(9)", the dimensions of the radiation decoupling elements "(4)" satisfy the condition $0 < (b+b')/h < \cot(\alpha_T)$ where $\alpha_T$ is the critical angle of total reflection for the light emerging from the active layer stack "(7)" into the surrounding medium.

9. The electroluminescent body as claimed in claim 1, wherein a reflective layer "(13)" is provided on the substrate "(2)" between the radiation decoupling elements "(4)".

UNITED STATES PATENT AND TRADEMARK OFFICE
CERTIFICATE OF CORRECTION

PATENT NO.      : 7,135,711 B2
APPLICATION NO. : 10/488487
DATED           : November 14, 2006
INVENTOR(S)     : Norbert Linder et al.

It is certified that error appears in the above-identified patent and that said Letters Patent is hereby corrected as shown below:

10. The electroluminescent body as claimed in claim 1, wherein the region between contact element "(9)" and emission zone "(8)" at least partially comprises a material whose conductivity is so low that essentially no current spreading or a current spreading of at most 20 μm is effected in the event of the operating current being injected vertically in the region between the contact element "(9)" and the emission zone "(8)".

11. The electroluminescent body as claimed in claim 1, wherein the active layer stack has, at least between contact element "(9)" and emission zone "(8)" a semiconductor layer made of $Al_xGa_yIn_{1-x-y}N$, where $0 \leq x \leq 1$, $0 \leq y \leq 1$ and $x+y \leq 1$, the transverse conductivity of which is so low that essentially no current spreading or a current spreading of at most 20 μm is effected in the event of the operating current being injected vertically in the region between the contact element "(9)" and the emission zone "(8)".

14. The electroluminescent body as claimed in claim 11, wherein the active layer stack "(7)" is fabricated altogether from semiconductor layers made of $Al_xGa_yIn_{1-x-y}N$ where $0 \leq x \leq 1$, $0 \leq y \leq 1$.

UNITED STATES PATENT AND TRADEMARK OFFICE
CERTIFICATE OF CORRECTION

PATENT NO. : 7,135,711 B2
APPLICATION NO. : 10/488487
DATED : November 14, 2006
INVENTOR(S) : Norbert Linder et al.

It is certified that error appears in the above-identified patent and that said Letters Patent is hereby corrected as shown below:

15. The electroluminescent body as claimed in claim 11, wherein the substrate "(2)" is a sapphire substrate."

Signed and Sealed this

Twenty-ninth Day of September, 2009

David J. Kappos
*Director of the United States Patent and Trademark Office*